United States Patent
Taskar et al.

(10) Patent No.: US 10,431,431 B2
(45) Date of Patent: Oct. 1, 2019

(54) GAS SUPPLY DELIVERY ARRANGEMENT INCLUDING A GAS SPLITTER FOR TUNABLE GAS FLOW CONTROL

(71) Applicant: Lam Research Corporation, Fremont, CA (US)

(72) Inventors: Mark Taskar, San Mateo, CA (US);
Iqbal Shareef, Fremont, CA (US);
Anthony Zemlock, Tracy, CA (US);
Ryan Bise, Los Gatos, CA (US);
Nathan Kugland, Oakland, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 760 days.

(21) Appl. No.: 14/886,458

(22) Filed: Oct. 19, 2015

(65) Prior Publication Data

US 2016/0111258 A1    Apr. 21, 2016

Related U.S. Application Data

(60) Provisional application No. 62/065,497, filed on Oct. 17, 2014.

(51) Int. Cl.
*H01J 37/32* (2006.01)
*C23C 16/455* (2006.01)
(Continued)

(52) U.S. Cl.
CPC .......... *H01J 37/3244* (2013.01); *C23C 14/22* (2013.01); *C23C 16/45544* (2013.01);
(Continued)

(58) Field of Classification Search
CPC ............. H01J 37/3244; H01J 37/32449; H01J 37/32009; C23C 16/45561; C23C 16/52;
(Continued)

(56) References Cited

U.S. PATENT DOCUMENTS 5,453,124 A    9/1995   Moslehi et al.
7,169,231 B2 *  1/2007   Larson .............. H01L 21/67017
                                                              118/715
(Continued)

FOREIGN PATENT DOCUMENTS

CN      1468441 A      1/2004
CN    101496144 A      7/2009
WO    WO-0231858 A2    4/2002

OTHER PUBLICATIONS

International Search Report dated Feb. 3, 2016 for corresponding Application No. PCT/US2015/055971.
(Continued)

*Primary Examiner* — Jeffrie R Lund

(57) ABSTRACT

A gas supply delivery arrangement of a plasma processing system for processing a substrate with gases introduced through at least first, second, and third gas injection zones comprises process gas supply inlets and tuning gas inlets. A mixing manifold comprises gas sticks in fluid communication with a process gas supply and tuning gas sticks in fluid communication with a tuning gas supply. A first gas outlet delivers gas to the first gas injection zone, a second gas outlet delivers gas to the second gas injection zone, and a third gas outlet delivers gas to the third gas injection zone. A gas splitter is in fluid communication with the mixing manifold, and includes a first valve arrangement which splits mixed gas exiting the mixing manifold into a first mixed gas supplied to the first gas outlet and a second mixed gas supplied to the second, and/or third gas outlets.

9 Claims, 5 Drawing Sheets

(51) Int. Cl.
  *C23C 16/52*   (2006.01)
  *C23C 14/22*   (2006.01)
  *H01L 21/67*   (2006.01)
  *C23C 16/50*   (2006.01)
  *H01L 21/311*  (2006.01)

(52) U.S. Cl.
  CPC .. *C23C 16/45561* (2013.01); *C23C 16/45565* (2013.01); *C23C 16/50* (2013.01); *C23C 16/52* (2013.01); *H01J 37/32009* (2013.01); *H01J 37/32449* (2013.01); *H01L 21/67069* (2013.01); *H01L 21/31116* (2013.01)

(58) Field of Classification Search
  CPC ........ C23C 16/45565; C23C 16/45544; C23C 14/22; C23C 16/50; H01L 21/67069; H01L 21/31116
  See application file for complete search history.

(56) References Cited

U.S. PATENT DOCUMENTS

| | | | | |
|---|---|---|---|---|
| 7,371,332 | B2* | 5/2008 | Larson | H01L 21/67017 156/345.29 |
| 8,088,248 | B2* | 1/2012 | Larson | C23C 16/45561 156/345.33 |
| 8,313,611 | B2* | 11/2012 | Larson | C23C 16/45561 156/345.33 |
| 8,772,171 | B2* | 7/2014 | Larson | C23C 16/45561 438/706 |
| 8,801,892 | B2* | 8/2014 | Larson | H01L 21/67017 118/696 |
| 9,234,775 | B2* | 1/2016 | Larson | G01F 1/36 |
| 2004/0112538 | A1* | 6/2004 | Larson | H01L 21/67017 156/345.33 |
| 2004/0112539 | A1* | 6/2004 | Larson | H01L 21/67017 156/345.33 |
| 2004/0112540 | A1* | 6/2004 | Larson | G05D 7/0664 156/345.33 |
| 2005/0098535 | A1 | 5/2005 | Lansford et al. | |
| 2007/0158025 | A1 | 7/2007 | Larson | |
| 2007/0172968 | A1 | 7/2007 | Kang et al. | |
| 2008/0202610 | A1 | 8/2008 | Gold et al. | |
| 2008/0210377 | A1* | 9/2008 | Larson | H01L 21/67017 156/345.29 |
| 2009/0218317 | A1 | 9/2009 | Belen et al. | |
| 2012/0070997 | A1* | 3/2012 | Larson | C23C 16/45561 438/710 |
| 2014/0033828 | A1* | 2/2014 | Larson | G01F 1/36 73/861.61 |
| 2014/0148015 | A1* | 5/2014 | Larson | C23C 16/45561 438/714 |
| 2016/0111258 | A1* | 4/2016 | Taskar | H01J 7/32449 156/345.24 |
| 2017/0031370 | A1* | 2/2017 | Drewery | H01L 21/67 |
| 2017/0032982 | A1* | 2/2017 | Drewery | H01L 21/67017 |
| 2017/0330734 | A1* | 11/2017 | Lee | H01J 37/3244 |
| 2017/0345626 | A1* | 11/2017 | Coppa | H01J 37/32963 |

OTHER PUBLICATIONS

Chinese Office Action dated May 28, 2018 for corresponding Application No. CN201580056455.8.
European Search Report dated May 3, 2018 for corresponding Application No. EP15851416.
Taiwanese Office Action and Search Report for Taiwanese Application No. 104134151, dated Apr. 3, 2019. Translation provided.

* cited by examiner

GAS SUPPLY DELIVERY ARRANGEMENT INCLUDING A GAS SPLITTER FOR TUNABLE GAS FLOW CONTROL

CROSS REFERENCE TO RELATED APPLICATION

This application claims priority under 35 U.S.C. § 119(e) to U.S. provisional Application No. 62/065,497, filed on Oct. 17, 2014, the entire content of which is incorporated herein by reference.

BACKGROUND

Semiconductor structures are processed in plasma processing apparatuses including a plasma processing chamber, a gas source that supplies process gas into the chamber, and an energy source that produces plasma from the process gas. Semiconductor structures are processed in such apparatuses by techniques including dry etching processes, deposition processes, such as chemical vapor deposition (CVD), physical vapor deposition, or plasma-enhanced chemical vapor deposition (PECVD) of metal, dielectric and semiconductor materials and resist stripping processes. Different process gases are used for these processing techniques, as well as processing different materials of semiconductor structures.

SUMMARY

Disclosed herein is a gas supply delivery arrangement for supplying process gas to a chamber of a plasma processing system wherein a semiconductor substrate is processed with gases introduced through at least first, second, and third gas injection zones. The gas supply delivery arrangement comprises a plurality of process gas supply inlets and a plurality of tuning gas inlets. A mixing manifold comprises a plurality of gas supply sticks each of which is adapted to provide fluid communication with a respective process gas supply, and a plurality of tuning gas sticks each of which is adapted to provide fluid communication with a respective tuning gas supply. A first gas outlet is adapted to deliver gas to the first gas injection zone, a second gas outlet is adapted to deliver gas to the second gas injection zone, and a third gas outlet is adapted to deliver gas to the third gas injection zone. A gas splitter is in fluid communication with the mixing manifold, the gas splitter including a first valve arrangement which splits mixed gas exiting the mixing manifold into a first mixed gas which can be supplied to the first gas outlet and a second mixed gas which can be supplied to the second and/or third gas outlets. A second valve arrangement selectively delivers tuning gas from the tuning gas sticks to the first, second, and/or third gas outlets.

Also disclosed herein is a method of using a gas supply delivery arrangement for supplying process gas to a chamber of a plasma processing system wherein a semiconductor substrate is processed with gases introduced through at least first, second, and third gas injection zones. The gas supply delivery arrangement comprising a plurality of process gas supply inlets and a plurality of tuning gas inlets, a mixing manifold comprising a plurality of gas supply sticks each of which is adapted to provide fluid communication with a respective process gas supply, a plurality of tuning gas sticks each of which is adapted to provide fluid communication with a respective tuning gas supply, a first gas outlet adapted to deliver gas to the first gas injection zone, a second gas outlet adapted to deliver gas to the second gas injection zone, and a third gas outlet adapted to deliver gas to the third gas injection zone, a gas splitter in fluid communication with the mixing manifold, the gas splitter including a first valve arrangement which splits mixed gas exiting the mixing manifold into a first mixed gas which can be supplied to the first gas outlet and a second mixed gas which can be supplied to the second and/or third gas outlets, and a second valve arrangement which selectively delivers tuning gas from the tuning gas sticks to the first, second, and/or third gas outlets. The method comprises operating the first valve arrangement to deliver the first mixed gas to the first gas outlet and the second mixed gas to the second and/or third gas outlets, and operating the second valve arrangement to deliver one or more tuning gases to the first, second and/or third gas outlets.

Further disclosed herein is a gas supply delivery arrangement of a semiconductor substrate processing apparatus comprising a gas panel in fluid communication with a plurality of gas sources, a respective mass flow controller for each gas source operable to control supply a gas from a respective gas source through the gas panel, and a gas splitter attached to the gas panel, the gas splitter in fluid communication with multiple gas zone feeds which are configured to be in fluid communication with respective gas injection zones of a process chamber of the semiconductor substrate processing apparatus, the gas splitter operable to receive one or more gases supplied through the gas panel from respective ones of the gas sources and control a ratio of the one or more gases received thereby supplied to respective ones of the multiple gas zone feeds.

BRIEF DESCRIPTION OF THE DRAWING FIGURES

FIG. 1 is a sectional view of an exemplary embodiment of a semiconductor substrate processing apparatus that preferred embodiments of the gas supply delivery arrangement can be used with.

DETAILED DESCRIPTION

Figure 1:
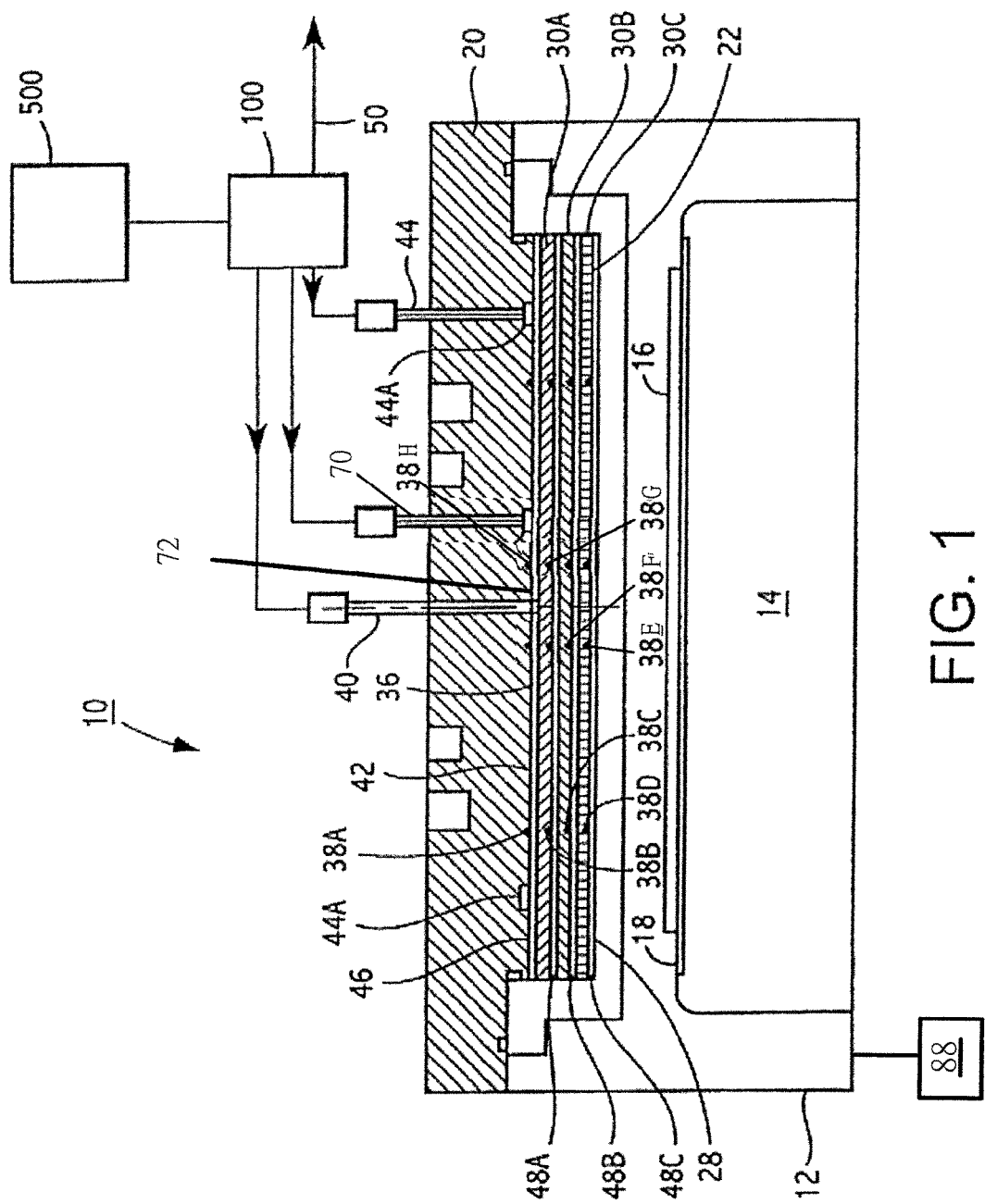

Semiconductor substrate processing apparatus such as plasma processing apparatuses for processing semiconductor materials, such as semiconductor devices formed on semiconductor substrates, e.g., silicon wafers, can include a plasma processing chamber or vacuum chamber and a gas supply delivery arrangement that supplies process gas into the plasma processing chamber. The gas supply delivery arrangement can distribute gas to multiple regions (or zones) across the surface of a semiconductor substrate during plasma processing through multiple gas flow feeds to the respective zones across the surface of the semiconductor substrate. The gas supply delivery arrangement can include flow controllers to control the flow ratio of the same process gas or different process gases, or the same or different gas mixture, to the zones, thereby allowing in-process or between process adjustment of across-substrate uniformity of gas flow and gas composition and thereby the uniformity of substrate processing.

Although multiple-zone gas supply delivery arrangements can provide improved flow control as compared to a single-zone system, it may be desirable to provide such multiple-zone systems with an arrangement that allows semiconductor substrate processing operations in which the gas composition can be tuned and/or the gas flow rate can be finely controlled within each respective zone so as to control an etch or deposition rate at a region of the semiconductor substrate corresponding to each respective zone such as radial regions which may include a center region, a middle region, or an edge region.

A multi-zone distribution system is provided for supplying different gas compositions and/or flow rates of gas to a vacuum or process chamber. In a preferred embodiment, the gas supply delivery arrangement is adapted to be in fluid communication with an interior of the vacuum chamber, such as a plasma processing chamber of a plasma processing apparatus, and provide the capability of supplying different gas chemistries and/or gas flow rates to respective zones of the vacuum chamber during processing operations. For example, process gas can be supplied through multiple zones of a gas distribution plate of an inductively coupled plasma chamber, a showerhead electrode of a showerhead electrode assembly, a multi-zone gas injector, side gas injectors, gas ring or other suitable arrangement which delivers gas to respective zones or regions across the upper surface of a semiconductor substrate as explained below.

The plasma processing apparatus can be a low-density, medium-density or high-density plasma reactor including an energy source that uses RF energy, microwave energy, magnetic fields, or the like to produce plasma. For example, the high-density plasma can be produced in a transformer coupled plasma (TCP™) reactor, also known as an inductively coupled plasma chamber, an electron-cyclotron resonance (ECR) plasma reactor, a capacitive-type discharge reactor, a capacitively coupled plasma processing chamber or the like. Exemplary plasma reactors that embodiments of the gas supply delivery arrangement can be used with include Exelan™ plasma reactors, such as the 2300 Excelan™ plasma reactor, available from Lam Research Corporation, located in Fremont, Calif. In an embodiment, a plasma processing system as disclosed herein can include a chamber which is an inductively coupled plasma processing chamber in which the gas injection system is a gas distribution plate, or alternatively, the chamber is a capacitively coupled plasma processing chamber in which the gas injection system may be a showerhead electrode. During plasma etching processes, multiple frequencies can be applied to a substrate support incorporating an electrode and an electrostatic chuck. Alternatively, in dual-frequency plasma reactors, different frequencies can be applied to the substrate support and an electrode, such as a showerhead electrode, spaced from the semiconductor substrate so as to define a plasma generation region.

Preferably, the gas supply delivery arrangement is capable of providing controllable and tunable gas delivery to multiple injection zones of a plasma processing chamber so as to distribute gas to respective zones across the surface of a semiconductor substrate during plasma processing. Gas or gas mixture, as used herein may refer to one or more process gases, one or more inert gases, one or more tuning gases or combinations thereof. For example, multi-zone gas feeds to a first, second, and third zone such as a center zone, a middle zone surrounding the center zone, and edge zone surrounding the middle zone of a showerhead electrode assembly can improve the center, middle, and edge etch rate uniformity of a semiconductor substrate being etched in the plasma processing chamber during plasma processing when the gas composition and/or flow rate of gas delivery to the respective zones is controlled and tuned.

The gas supply delivery arrangement, as disclosed herein, can include a series of gas distribution and control components such as one or more mass flow controllers (MFC) in fluid communication with one or more respective gas supplies, one or more pressure transducers and/or regulators, heaters, one or more filters or purifiers, and shutoff valves. The components used in a given gas supply delivery arrangement can vary depending upon the design and intended application of the gas supply delivery arrangement. In an embodiment of a semiconductor processing arrangement, over seventeen gases may be connected to the processing chamber via gas supply lines, gas distribution components, and mixing manifolds. These components are attached to a base plate forming a complete system known as a "gas panel" or "gas box."

A "gas stick" comprises multiple integrated surface mount components (e.g., valve, filter, etc.) that are connected to other gas control components through channels of the mixing manifold, upon which the gas control components can be mounted. Each component of the gas stick is typically positioned above a manifold block. A plurality of manifold blocks form a modular substrate, a layer of manifold blocks that creates the flow path of gases through the gas stick. With shrinking features sizes, improvements in gas delivery systems to improve etch rate uniformity on substrates being processed is desirable.

Disclosed herein is a gas supply delivery arrangement (i.e. a multi-zone gas delivery system) including a multi-zone gas flow splitter for splitting and distributing precise quantities of process and tuning gases, which may be incorporated in a gas panel, and tune the composition of the gas and/or control the flow rate of the gas to multiple zones of the processing chamber.

The gas mixture may be split and thereby controlled by the gas supply delivery arrangement including the gas splitter by varying percent of gas fed to each of the zones so as to control the processing rate across the surface of a semiconductor substrate at the respective zones thereof. The composition of the gas among the zones may be tuned by the multi-zone gas flow splitter so as to control the processing rate at the surface of a semiconductor substrate at the respective zones. Thus, the gas delivery through the multiple zones may be controlled and tuned among multiple configurations achievable by the multi-zone gas delivery system including the gas splitter to meet the needs of particular processing requirements for a respective material layer forming the upper surface of the semiconductor substrate.

The multi-zone gas delivery system includes multi-zone gas feeds wherein each gas feed may deliver gas to the respective multiple injection zones of the processing chamber. The multi-zone gas delivery system includes an orifice based gas splitter and several tuning gas delivery sticks operable to provide tight and accurate gas delivery distribution to each zone. The splitting occurs when valves of the gas splitter, that control a variety of active orifices, each operable to supply gas therethrough at an individualized output flow, based on the respective tolerances in the diameters thereof, of the gas splitter, are arranged per certain process regime ratios. Per desired ratio formed through one or more of the active orifices, an amount of gas flow is distributed to each injection zone of the multiple injection zones of the process chamber. In addition each tuning gas stick has an ability to connect to a process gas line, to be mixed with a feed line or alternatively delivered individually to the injection points of a respective injection zone of for example a showerhead electrode in of the process chamber of a semiconductor substrate processing apparatus. The design of the gas supply delivery arrangement, including the gas splitter, permits modification thereof, including independent adjustment of gas flow to multiple injection zones of the process chamber.

Multiple gas feeds are an extension of the gas panel that includes the gas splitter. The multiple gas feeds have the ability to distribute mixtures or individually supply species of gas to the multiple injection zones in plasma processing chambers wherein the gas splitter may deliver the gas to the respective feeds of the multiple gas feeds (i.e. the gas splitter may take a single gas feed input and split it into multiple lines, such as the respective multiple gas feeds) to the injection zones chamber). Multiple gas feeds improve, for example, center, middle, and edge zone etch rate uniformity across the corresponding zone of the surface of a substrate being processed. The gas mixture is split and controlled when the gas splitter varies gas feed percentage for each zone, as well varies the composition of the gas being supplied to one or more of the respective zones. Various combinations of valves being opened or shut in the gas splitter for supplying gas to different respective zones of the process chamber deliver the desired ratio of mixed gas to the multiple gas feeds each forming a gas delivery line to the respective gas injection zone. The gas delivery lines are routed from the gas box (i.e. gas panel) to the processing chamber for this function.

The aforementioned design permits multiple configurations of the multi-zone gas delivery system to meet the needs of particular processing requirements. For example, during a multi-step etching process different layers of a semiconductor substrate will require different flow rates and gas compositions to individual injection zones of the processing chamber for a given etching process. The layers of the semiconductor substrate may include a base material, such as a silicon wafer; intermediate layers of materials to be processed, e.g., etched or deposited on, over the base material; and a masking layer over the intermediate layer. The intermediate layers may include conductive, dielectric, and semiconductive materials. The masking layer can be patterned photoresist material having an opening pattern for etching desired features, e.g., holes, vias and/or trenches, in the intermediate layers. For example, a multi-layer film stack (semiconductor substrate) including various layers which are processed during a multi-step etching process is disclosed in commonly-assigned U.S. Pat. No. 8,668,835, which is incorporated herein by reference in its entirety.

Exemplary dielectric materials that can be processed are, for example, doped silicon oxide, such as fluorinated silicon oxide; un-doped silicon oxide, such as silicon dioxide; spin-on glass; silicate glasses; doped or un-doped thermal silicon oxide; and doped or un-doped TEOS deposited silicon oxide. The dielectric material can be a low-k material having a selected k value. Such dielectric materials can overlie a conductive or semiconductive layer, such as polycrystalline silicon; metals, such as aluminum, copper, titanium, tungsten, molybdenum and their alloys; nitrides, such as titanium nitride; and metal silicides, such as titanium silicide, tungsten silicide and molybdenum silicide.

Etching of each aforementioned material forming a layer of the semiconductor substrate requires different etch gas chemistries and adjustments in gas chemistries across the substrate to achieve optimum etch results. The valves and orifices included in the gas splitter of the gas supply delivery arrangement provide multi-flow control capability, for 0-100% and 100-0% and step increments of less than or equal to about 10% from 90-10% and 10-90% for each respective zone. Further, a manometer may be used as a diagnostic tool to determine if any of the orifices of the multi-zone gas flow splitter are plugged. In addition, tuning gas adjustments to each zone can be effected in minute amounts as low as 0.1 sccm to fine tune etch results in each zone.

The multi-zone gas flow splitter is operable to precisely control flow rate through the respective injection zones of the process chamber. In many plasma etching processes, a center etch rate of a semiconductor substrate is higher than a middle zone etch rate, and/or an edge zone etch rate. Thus, by fine tuning the gas composition and flow rate the center etch rate may be reduced so as to be uniform with the middle zone etch rate and the edge zone edge rate. For example, to fine tune etch results in a center zone, additions of process and/or tuning gas in increments of 0.1 to 1 sccm of gas addition to the center zone can be provided to achieve more uniform etch results.

The orifice based gas splitter and several tuning gas delivery sticks provide tight and accurate gas delivery distribution to each zone so as allow, for example, increases or decreases in flow rate of about 0.1 to 1 sccm of process/tuning gas to be delivered to an injection zone while supplying higher flow rates of mixed process gas to other injection zones. The gas splitter includes valves which are opened and closed to thereby deliver the desired ratio of mixed gas through the orifices having fixed sizes wherein the combination of orifices selected controls the gas flow rate therethrough to provide desired ratios of mixed gas delivered through gas outlets of the gas delivery system. The orifice sizes and location thereof are controlled as critical features which control the gas flow rate of gas delivered therethrough. The multi-zone gas flow splitter is arranged for certain process regimes and is controlled by a controller operable to fire predetermined valve combinations to control the flow rate of gas to each of the respective zones. Further, tuning gas sticks can be used to locally modify the chemistry (i.e. composition) of gas in each zone.

The gas panel of the gas supply delivery arrangement is in fluid communication with a gas supply section which is connected to the controller to control operation of the flow control components including MFCs and the valves of the gas splitter to allow control of the composition of two or more gases that can be supplied by the gas supply section through the gas panel to the gas splitter and then subsequently to the multiple gas feeds which deliver the gas to the respective gas injection zones of the process chamber. In an embodiment, the gas supply section includes multiple gas sources, such as 17 individual gas sources, with process and tuning gases in fluid communication with the gas splitter and tuning gases arranged to bypass the gas splitter for direct injection into the gas injection zones. As such, the gas supply section can supply many different desired gas mixtures to the injection zones of the process chamber through the gas splitter and respective multiple gas feeds in fluid communication with the respective gas injection zones.

The number of gas sources included in the gas supply delivery arrangement is not limited to any particular number of gas sources, but preferably includes at least two different gas sources. For example, the gas supply section can include more than or less than eight gas sources, such as up to 17 gas sources, each in fluid communication with the gas splitter through the gas panel and a respective MFC. The different gases that can be provided by the respective gas sources include individual gases, such as $O_2$, Ar, $H_2$, $Cl_2$, $N_2$ and the like, as well as gaseous fluorocarbon and/or fluorohydrocarbon compounds, such as $CF_4$, $CH_3F$ and the like. In an embodiment, the process chamber is a plasma processing etch chamber and the gas sources can supply Ar, $O_2$, $N_2$, $Cl_2$, $CH_3$, $CF_4$, $C_4F_8$ and $CH_3F$ or $CHF_3$ (in any suitable order thereof). The particular gases supplied by the respective gas sources can be selected based on the desired process that is to be performed in the plasma processing chamber, which is determined by the particular material composition of an upper surface of the semiconductor substrate to be processed, e.g., a particular dry etching and/or material deposition process. The gas supply section can provide broad versatility regarding the choice of gases that can be supplied for performing etching processes.

The gas supply section preferably also includes at least one tuning gas source to adjust the gas composition. The tuning gas can be, e.g., $O_2$, an inert gas, such as argon, or a reactive gas, such as a fluorocarbon or fluorohydrocarbon gas, e.g., $C_4F_8$. In the embodiment the gas supply section can include four tuning gas sources wherein the tuning gas source can supply tuning gas to adjust the composition of a gas being delivered to the gas splitter before said gas reaches said gas splitter, or the gas splitter may combine the tuning gas and process gas therein to adjust to composition of the gas mixture being delivered to any one of the respective gas injection zones through the respective multiple gas feed lines. Alternatively, the gas supply delivery arrangement is operable to supply a tuning gas directly to a respective one of the multiple gas feeds which are each in fluid communication with a respective gas injection zone of the processing chamber.

The pressure upstream of the orifices of the gas splitter 700 are preferably precisely measured and collected from a 500 Torr manometer, such as manometer DGF-2 in fluid communication with the gas splitter 700 via valve v540. The design permits modification of the multi-zone gas delivery system for particular processing requirements, including an independent adjustment of the gas flow to multiple gas injection zones in the chamber corresponding to respective zones across the upper surface of a semiconductor substrate being processed. Further, and gas splitter can include an output AFV through valve v605, wherein in an embodiment the output AFV can be used to bypass the gas flow splitter 700 or provide additional gas flow output through the gas flow splitter 700.

Figure 2:
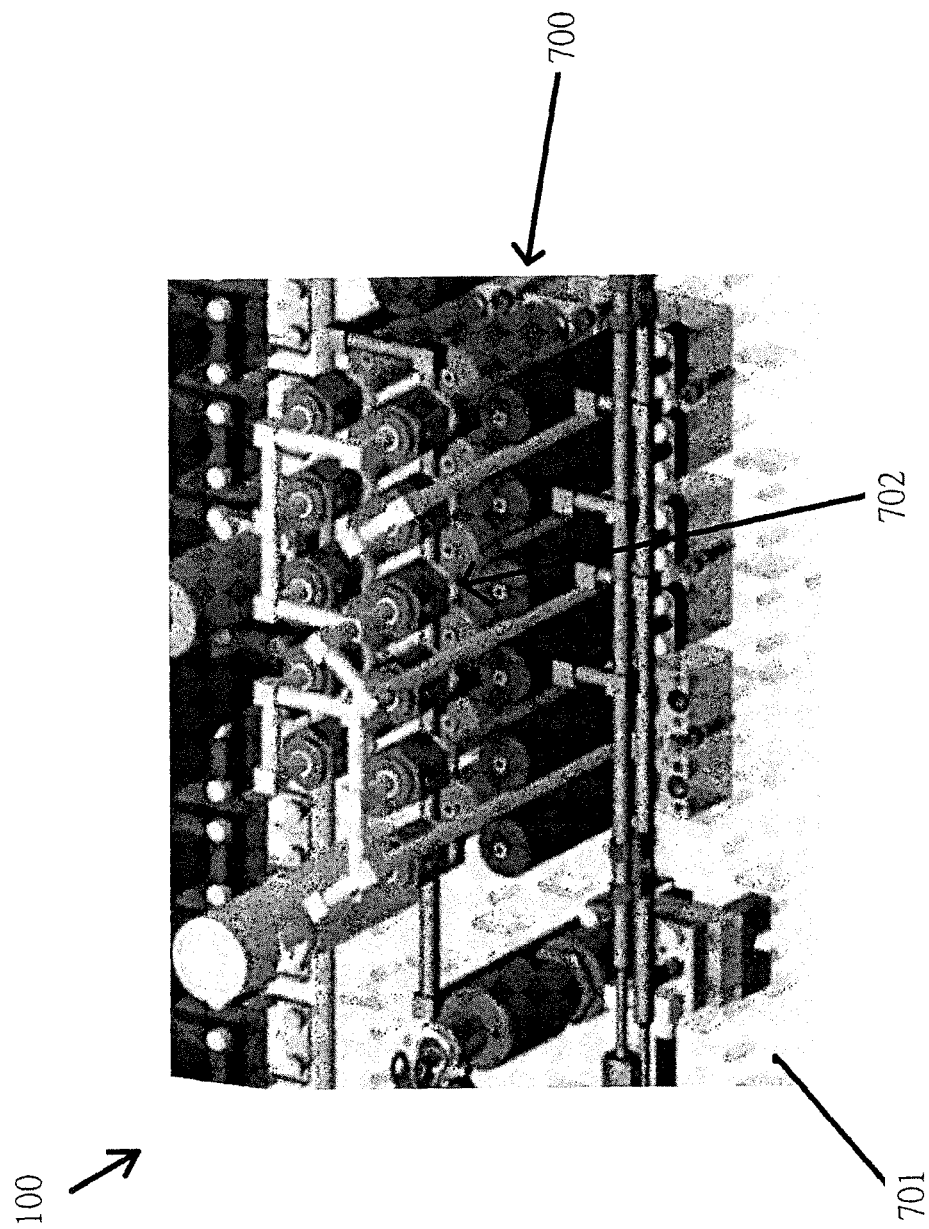
FIG. 2 illustrates an isometric view of a portion of a gas panel of a gas supply delivery arrangement including a multi-zone gas flow splitter.

A large number of possible valve combinations by the gas splitter of the gas panel of the gas supply delivery arrangement allows for many tunable and controllable gas flows through the orifices thereof. For example, FIG. 2 illustrates an isometric view of a portion of a gas panel 701 of a gas supply delivery arrangement 100 including a multi-zone gas flow splitter 700 including 11 two-state valves 702 used to perform the splitting. The maximum number of different valve combinations is $2^{11}=4096$, although some of these states may be invalid (for example all valves closed or excessively large or small splits to the various zones). In practice nearly 1,000 combinations are usable. An algorithmic approach is used to efficiently select a subset of these combinations, so as to control the ratio of gas supplied to each injection zone of the process chamber through the respective multiple gas zone feeds. The algorithmic approach may select combinations of valves which produce outputs which are combinations of valves for each respective gas injection zone which in close spatial proximity to each other or alternatively the algorithm may select for valve combinations that minimize the total uncertainty in the output flow of gas, based on the tolerances in the diameters of the individual orifices.

FIG. 1 depicts an exemplary semiconductor material plasma processing apparatus 10 that embodiments of the gas supply delivery arrangement 100 can be used with. The apparatus 10 comprises a vacuum chamber or plasma processing chamber 12 having an interior containing a substrate support 14 on which a semiconductor substrate 16 is supported during plasma processing. The substrate support 14 includes a clamping device, preferably an electrostatic chuck 18, which is operable to clamp the semiconductor substrate 16 on the substrate support 14 during processing. The semiconductor substrate can be surrounded by focus rings and/or edge rings, ground extensions or other parts, such as parts disclosed in commonly-assigned U.S. Pat. No. 6,984,288, which is incorporated herein by reference in its entirety.

In a preferred embodiment, the plasma processing chamber 12 includes a plasma confinement zone having a volume of about ½ liter to about 4 liters, preferably about 1 liter to about 3 liters, for processing 200 mm or 300 mm wafers. Alternatively, the plasma confinement zone can have a volume of about 4 liters or greater for processing 450 mm wafers. The plasma processing chamber 12 can include a confinement ring arrangement to define a plasma confinement zone, such as disclosed in commonly-assigned U.S. Pat. No. 8,826,855, which is incorporated herein by reference in its entirety. The confinement mechanism can limit the fluid communication from the plasma volume to portions of the interior of the plasma processing chamber 12 that are outside of the plasma volume. Preferably, the gas supply delivery arrangement can replace such a volume of gas in the plasma confinement zone with another gas within a period of less than about 1 s, preferably in less than about 200 ms, without substantial back diffusion, wherein the gas distribution may include a gas switching arrangement such as that described in commonly-assigned U.S. Pat. No. 8,772,171, which is incorporated herein by reference in its entirety.

The plasma processing apparatus 10 shown in FIG. 1 includes a gas distribution system such as a showerhead electrode assembly having a support plate 20 forming a wall of the plasma chamber, and a showerhead 22 attached to the support plate wherein the showerhead includes multiple gas injection zones. A baffle assembly is located between the showerhead 22 and the support plate 20 to uniformly distribute process gas to a plasma exposed surface 28 of the multiple injection zones of the showerhead 22. The baffle assembly can include one or more baffle plates. In the embodiment, the baffle assembly includes baffle plates 30A, 30B and 30C. Open plenums 48A, 48B and 48C are defined between the baffle plates 30A, 30B and 30C; and between the baffle plate 30C and showerhead 22. The baffle plates 30A, 30B and 30C and showerhead 22 include through passages for flowing process gas into the interior of plasma processing chamber 12.

In the embodiment, the plenum between the plate 20 and the baffle plate 30A and the plenums 48A, 48B and 48C between the baffle plates 30A, 30B and 30C are divided into a center zone 72, a middle zone 42 surrounding the center zone 72, and an edge zone 46 surrounding the middle zone 42 by seals 38A, 38B, 38C, 38D, 38E, 38F, 38G, and 38H such as O-rings. The center zone 72, the middle zone 42, and edge zone 46 can be supplied process gas having different respective gas chemistries and/or flow rates by the gas supply delivery arrangement 100 as explained herein, preferably under control of a controller 500 which controls multiple gas sources and respective MFCs thereof, as well as the gas splitter. For example, gas is supplied from a center zone gas feed 40 into the center zone 72, gas is supplied from a middle zone gas feed 70 to the middle zone 42, and gas is supplied from an edge zone gas feed 44 into an annular channel 44*a* and then into the edge zone 46. The process gas flows through the passages in the baffle plates 30A, 30B and 30C and the through the respective injection zones of the showerhead 22, into the interior of the plasma processing chamber 12, and over the respective zones across the upper surface of the semiconductor substrate 16. The process gas is energized into the plasma state in the plasma processing chamber 12 by a power source, such as an RF source driving electrode 22, or a power source driving an electrode in the substrate support 14. The RF power applied to the electrode 22 can be varied when different gas compositions are supplied into the plasma processing chamber 12, preferably within a time period of less than about 1 s, more preferably less than about 200 ms. In an embodiment, the center zone 72, the middle zone 42, and the edge zone 46 can be supplied process gas having different respective gas chemistries and/or flow rates by the gas supply delivery arrangement 100.

In other preferred embodiments, the plasma processing apparatus 10 can include a tunable multi-zone gas injector system for injecting process gas into the plasma processing chamber. For example, the tunable multi-zone gas injector system can have a configuration as disclosed in commonly-owned U.S. Patent Application Publication No. 2010/0041238, which is incorporated herein by reference in its entirety. For example, a two zone center injector used with sidewall injectors that supply process gas to an outer zone of a plasma processing chamber wherein the different zones can be supplied process gas having different respective gas chemistries and/or flow rates by the gas supply delivery arrangement 100 (see commonly-assigned U.S. Patent Application 2011/0056626, the disclosure of which is incorporated herein by reference in its entirety). The gas supply delivery arrangement 100 can include a gas supply section, a flow control section, and optionally a gas switching section which are in fluid communication with one other. The plasma processing apparatus 10 includes a vacuum source 88 operable to evacuate process gases and reaction byproducts from the chamber 12.

Figure 3:
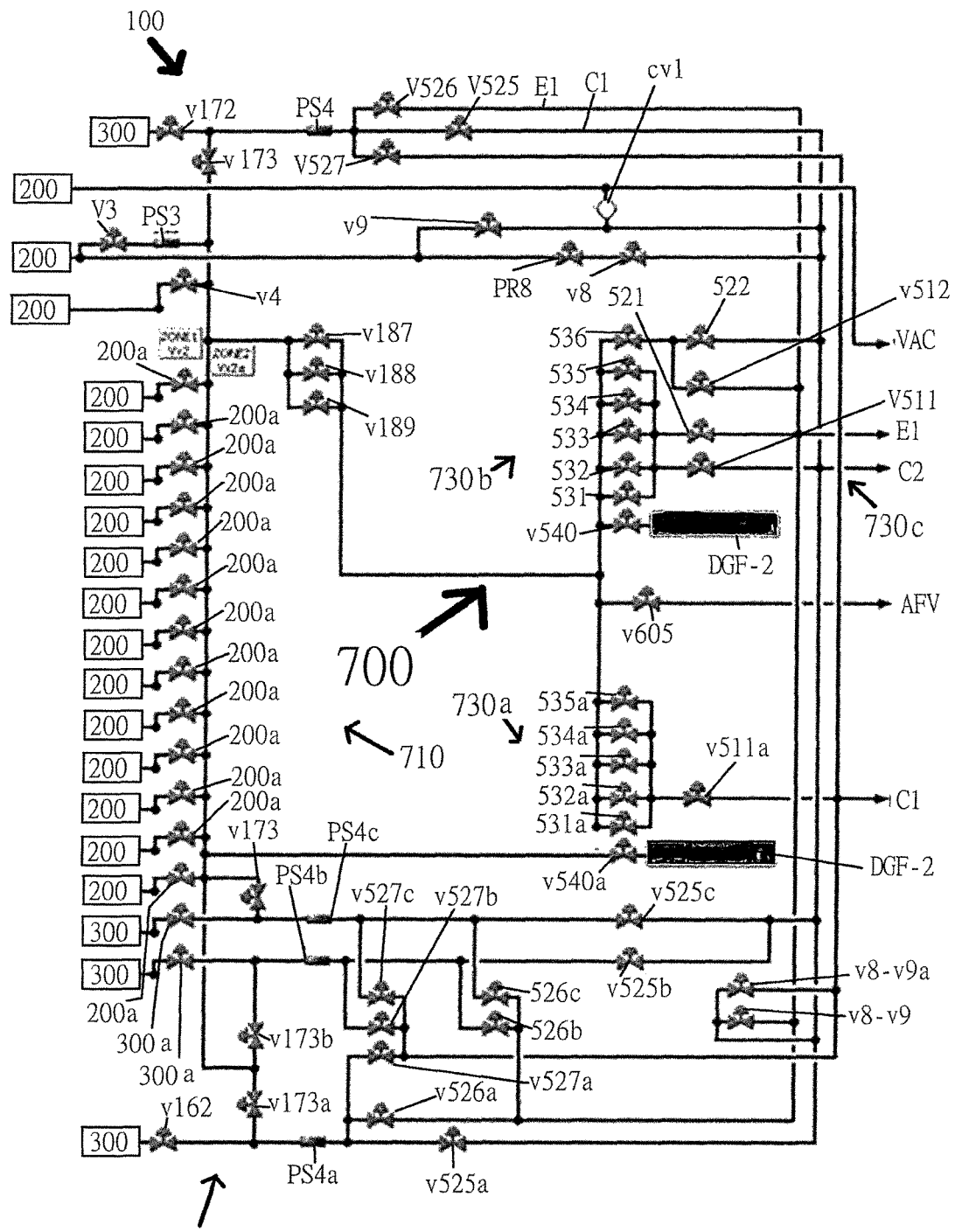
FIG. 3 shows a schematic diagram of a gas supply delivery arrangement including a mixing manifold and a gas splitter.

FIG. 3 illustrates a schematic of a gas supply delivery arrangement 100, as disclosed herein, for supplying process gas to a chamber of a plasma processing system wherein a semiconductor substrate is processed with gases introduced through at least first, second, and third gas injection zones. The gas supply delivery arrangement 100 includes a plurality of process gas supply inlets and a plurality of tuning gas inlets. A mixing manifold 710 comprising a plurality of gas supply sticks 200 each of which is adapted to provide fluid communication with a respective process gas supply. A plurality of tuning gas sticks, such as for example tuning gas sticks 300 each of which is adapted to be in fluid communication with a respective tuning gas supply and can also be in fluid communication with the mixing manifold 710 through respective valves 300*a* or v172, v162. A first gas outlet C1 is adapted to deliver gas to the first gas injection zone, a second gas outlet C2 is adapted to deliver gas to the second gas injection zone, and a third gas outlet E1 is adapted to deliver gas to the third gas injection zone. A gas splitter 700 is in fluid communication with the mixing manifold 710. The gas splitter 700 includes a first valve arrangement which splits mixed gas exiting the mixing manifold 710 into a first mixed gas which can be supplied to the first gas outlet C1 and a second mixed gas which can be supplied to the second and/or third gas outlets C2, E1. In an embodiment, the mixing manifold 710 can be in fluid communication with a manometer DGF-2 via valve 540*a*.

A second valve arrangement 720 is operable to selectively deliver tuning gas from the tuning gas sticks 300 to the first, second and/or third gas outlets C1, C2, E1. The second valve arrangement includes a first set of valves which can selectively deliver a first tuning gas to a first tuning gas conduit in fluid communication with the first gas outlet C1, the second gas outlet C2, the third gas outlet E1, or combination thereof, a second set of valves which selectively deliver a second tuning gas to a second tuning gas conduit in fluid communication with the first gas outlet C1, the second gas outlet C2, the third gas outlet E1, or combination thereof, a third set of valves which selectively deliver a third tuning gas to a third tuning gas conduit in fluid communication with the first gas outlet C1, the second gas outlet C2, the third gas outlet E1, or combination thereof, and a fourth set of valves which selectively delivers a fourth tuning gas to a fourth tuning gas conduit in fluid communication with the first gas outlet C1, the second gas outlet C2, the third gas outlet E1, or combination thereof. In the aforementioned embodiments, alternative valve configurations are operable to deliver the respective first, second, third, and/or fourth tuning gases to the first gas outlet C1, the second gas outlet C2, the third gas outlet E1, or combinations thereof as shown in FIG. 3. Further, the second set of valves includes valves which selectively connect the first, second, third and fourth tuning gas sticks 300 to the mixing manifold 710 and/or a purge line VAC. In an embodiment, the second valve arrangement 720 can include, but is not limited to valves v162, v525, v8-v9, v8-v9*a*, v172, v526, v527, v527*c*, v525*c*, v526*c*, v527*b*, v527*a*, v526*a*, v525*b*, v525*a*, v173*b*, v173*a*, v526*c*, v526*b*, v527*a*, v525*a*, v525*c* and v173. The gas lines between the valves of the second valve arrangement 720 can also include pressure sensors therealong such as but not limited to pressure sensors PS4*c*, PS4*b*, PS4*a*, PS4, and PS3.

FIG. 3 further a gas splitter 700 is operable to control the flow rate, and optionally also to adjust the composition, of different gases that can be supplied to the respective first, second, and third gas outlets C1, C2, and E1. The gas splitter 700 can provide different flow rates and/or chemistries of the gases from gas sources 200 supplied through respective valves 200*a*, V3, or v4 thereof wherein the gas sources 200 can be one of a process gas, inert gas, tuning gas or combination thereof depending on the processing operation to be performed. The process gas can be supplied from the respective gas sources 200 through the respective valves 200*a* through gas lines and associated valves generally including the label "v" as shown in FIG. 3 to the gas splitter 700. The mixing manifold 710 can supply gas in an embodiment to the gas splitter 700 via one or more of valves v187, v188, v189.

The first valve arrangement of the gas splitter 700 can include a first valve set 730*a* with critical orifices to precisely control a ratio of the first mixed gas and deliver the first mixed gas to the first gas outlet C1, a second valve set 730*b* with critical orifices to control a ratio of the second mixed gas and deliver the second mixed gas to the second and/or third gas outlet C2, E1, and a third valve set 730*c* which delivers the mixed gas to the second and/or third gas outlets C2, E1. In an embodiment, the first valve arrangement delivers the first mixed gas only to the first gas outlet C1 and the second mixed gas only to the second and/or third gas outlets C2, E1. In an embodiment the first valve set 730*a* can include the valves 531*a*, 532*a*, 533*a*, 534*a*, and 535*a*, and the second valve set 730b can include the valves 531, 532, 533, 534, 535, and 536. In an embodiment, the third valve set 730c can include at least the valves 521, 522, v512, and v511.

In addition, the flow rate and/or chemistry of the gas that is supplied to the plasma processing chamber 12 (see FIG. 1) can be different for the center zone 72, middle zone 42 and the edge zone 46. Accordingly, the gas splitter 700 can provide desired gas flows and/or gas chemistries to regions across the semiconductor substrate 16, thereby enhancing semiconductor substrate processing uniformity. In an embodiment, the gas supplied to the vacuum chamber through the gas injection zones may be switched wherein the multi-zone gas flow splitter 700 can be operable to divert a gas which is not currently being used, such as a gas for a subsequent step of a process operation, to a bypass line such as purge (i.e. by-pass) line VAC which can be in fluid communication with a vacuum pumping system, such as between a turbo pump and a roughing pump. The purge line VAC can be in fluid communication with one or more of the process gas supplies and/or tuning gas supplies via valve cv1.

In the embodiment as shown in FIG. 3, process gas can be supplied from one or more of the process gas sources 200 to the gas splitter 700 which includes for example 11 valves 531, 532, 533, 534, 535, 536, 531a, 532a, 533a, 534a, and 535a wherein a combination of the aforementioned valves may be adjusted to an on or off position so as to supply a ratio of the supplied gas thereto through the orifices of the valves in the open position and to the respective output lines E1, C1, C2, AFV, and/or VAC such that the gas may be supplied to a respective one of the multiple gas zone feeds and subsequently to a respective gas injection zone of a process chamber in fluid communication therewith. The valves 531-535a can be selectively opened or closed, preferably under control of the controller 500, to allow different gas mixtures to be flowed to the respective output lines wherein the unique orifice dimensions associated with each respective valve allow for the ratio of the flow rate to each respective gas injection zone of the process chamber to be finely tuned. For example, by opening one or more of the valves 531-535a associated with one or more of the gas sources 200 (while one or more of the remaining valves 531-535a associated with the other ones of the gas sources 200 are closed), allows first gas mixture to be supplied to a first gas injection zone, a second gas mixture to be supplied to a second gas injection zone, and a third gas mixture to be supplied to a third injection zone of the process chamber wherein the first, second, and third gas mixtures can be flowed at the same or different flow rates and wherein the composition of the gas mixtures may be the same, or alternatively the composition among the gas mixtures can be tuned so as to control the etch rate at the corresponding zone across the surface of a wafer to be processed. Accordingly, various mixtures and mass flow rates of gases can be provided to the output lines E1, C1, C2, AFV, and VAC (i.e. the by-pass/purge line) and thereby the respective ones of the multiple gas zone feeds and gas injection zones of the process chamber. In an embodiment, a process gas can by-pass the gas splitter 300 through valves, including but not limited to, valves v9 PR8, and v8.

In the embodiment shown in FIG. 3, each of the 11 valves 531-535a includes a respective orifice associated therewith wherein each orifice can have relative restriction sizes, e.g., diameters. Accordingly, when gas flow occurs through the one or more of the orifices, the total conductance of the gas delivered to an output of the gas supply delivery arrangement 100 can be controlled using a predetermined combination of the orifices associated with the respective valves 531-535a. Any number of the orifices can be opened to provide different ratios of the total conductance of the orifices directed to a single gas injection zone as compared to the conductance of the orifices directed to a different gas injection zone, in order to supply different ratios of the of gas flow to respective zones in order to control the processing rate of a substrate in the process chamber such as an etch rate at a respective zone across the surface of the semiconductor substrate. Further, opening certain orifices may supply a tuning gas to the gas mixture to fine tune the composition of gas reaching a respective zone in order to control the processing rate of a substrate in the process chamber such as an etch rate at a respective zone across the surface of the semiconductor substrate.

Another embodiment can include a different number of orifices and associated valves such as a number of valves greater than 11. The valves 531-535a are preferably located upstream of each of the respective orifices to control the flow of the gas to the orifices, however in an alternate embodiment the valves 531-535a may be disposed downstream of the orifices. In a preferred embodiment, valves 531-536 are dedicated to controlling a ratio of gas delivered to the middle and/or edge zones whereas valves 531a-535a are dedicated to controlling a ratio of gas delivered to the center zone via valve v511a.

The orifices associated with the respective valves 531-535a are operable to prevent pressure surges and flow instabilities in the gas flow when the gas supply delivery arrangement 100 changes the gas flowed into the plasma processing chamber 12 from for example a first gas mixture to the second gas mixture, and vice versa.

Figure 4:
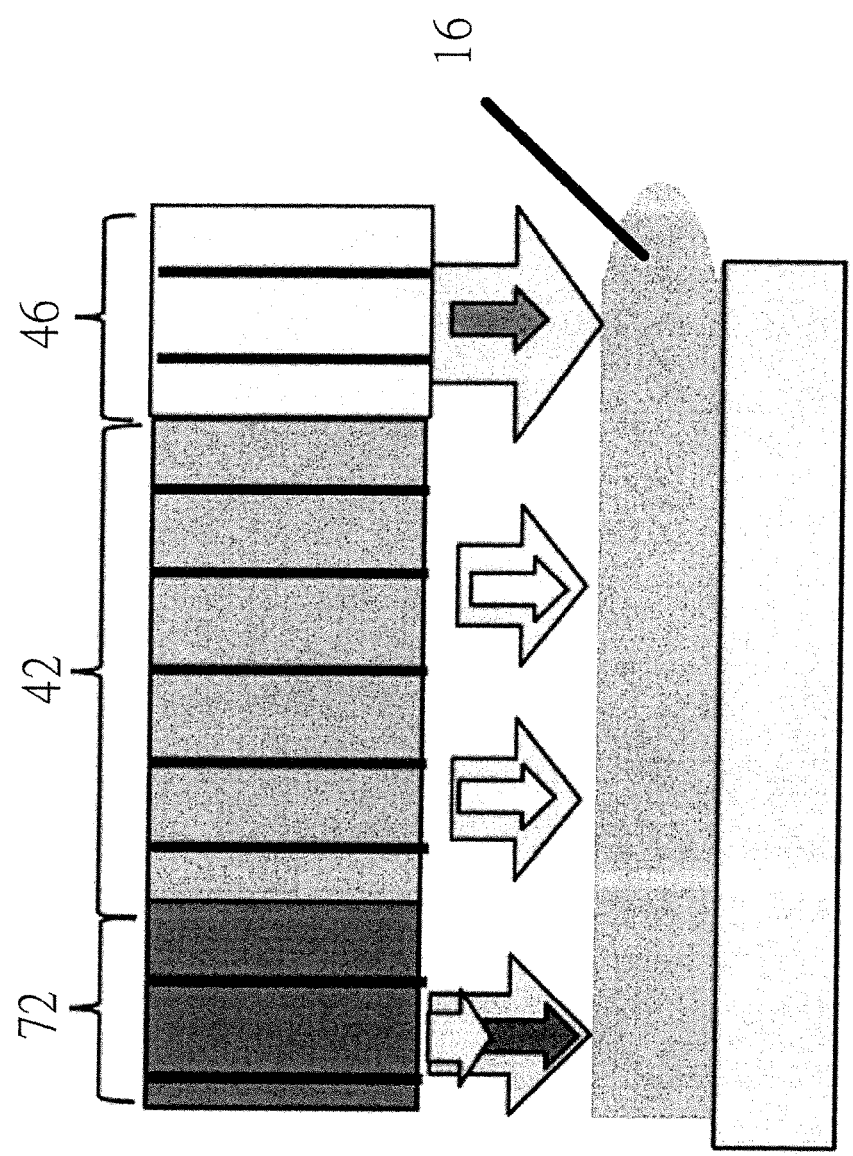
FIG. 4 illustrates a schematic of a semiconductor substrate receiving controlled and tuned process gas through a center injection zone, a middle injection zone, and an edge injection zone.

FIG. 4 illustrates a schematic of a semiconductor substrate 16 receiving controlled and tuned process gas through a center injection zone 72, a middle injection zone 42, and an edge injection zone 46. For example, as shown in FIG. 4, the semiconductor substrate 16 may include a first and second tuning gas being supplied to the center injection zone 72, a process gas and a third tuning gas 42 supplied to the middle injection zone 42, and a fourth tuning gas and a process gas being supplied to the edge injection zone 46. By controlling the composition of the gas as well as the flow rate of the gas supplied to the respective center, middle, and edge zones 72, 42, and 46 the substrate may be uniformly etched.

Figure 5:
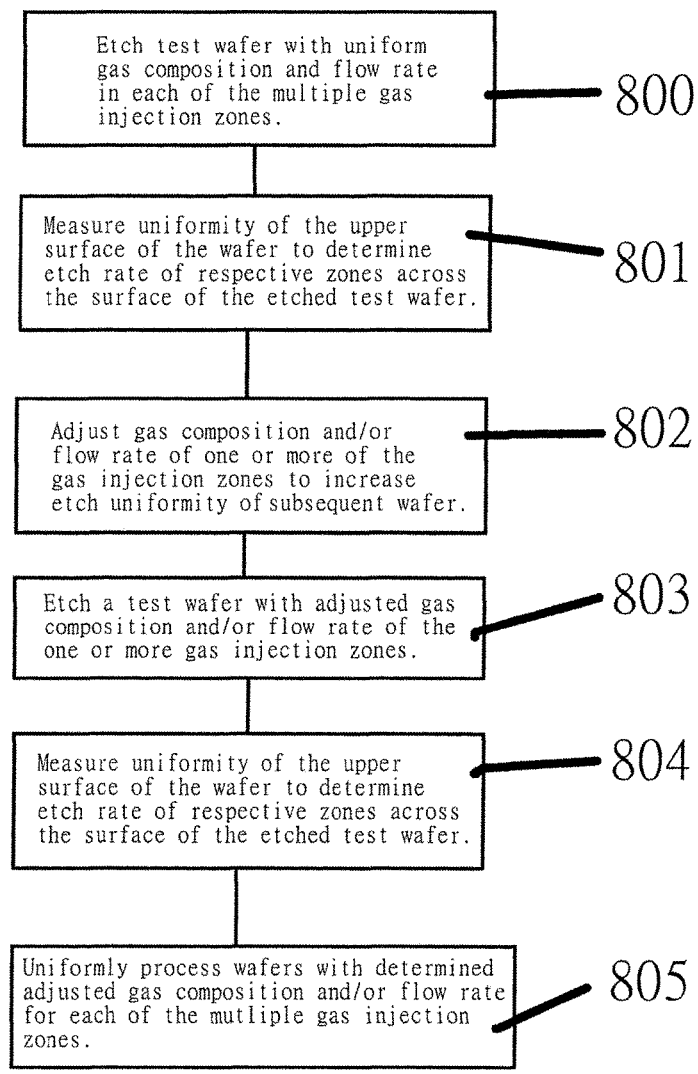
FIG. 5 shows a flow chart of a method of determining the gas composition and flow rate to uniformly process a wafer.

FIG. 5 shows a flow chart of a method of determining the gas composition and flow rate to uniformly process a wafer (i.e. semiconductor substrate), using multi-zone gas injection controlled by a gas splitter during an etching or deposition process, in a processing chamber such as that illustrate in FIG. 1 or the schematic of FIG. 4. First, in step 800, a test wafer is processed such as by an etching process wherein gas composition and flow rates are supplied to each of the multiple gas injection zones according to a process recipe wherein the composition and/or flow rate is controlled by the gas splitter 700. In step 801, the test wafer is then measured to determine the etch uniformity of the upper surface thereof to determine the etch rate of the respective zones across the surface of the test wafer. Then, in step 802, using the controller software, or the input of a process engineer, the gas composition and/or the flow rate to one or more of the gas injections zones is adjusted to increase etch uniformity across the zones of a subsequent test wafer. In step 803, a next test wafer may be etched with a modified etch recipe wherein gas composition and/or flow rates to the one or more gas injection zones is modified. The uniformity of the upper surface of the wafer is measured to determine the etch rate of the respective zones across the surface of the etched test wafer (step 804). If the uniformity of the upper surface of the test wafer as measured in step 804 is within a desired tolerance then a batch of wafers may be processed according to the modified recipe. If the uniformity of the wafer as measured in step 804 is not within the desired tolerance then steps 802-804 may be repeated until a test wafer is processed within the desired tolerance. In this manner, the gas composition and/or flow rate of the process gas through the multiple injection zones may be optimized for uniform wafer processing.

The optimization process shown in the FIG. 5 flow chart can be used to create a look up table wherein the look up table can be stored in a suitable memory as part of the controller 500 such that a user may adjust or modify a given etch process according to the data stored in the look up table. Alternatively, a preexisting look up table can be included in the system software wherein the controller 500 software can modify the process recipe based upon the data included in the look up table. During optimization processes, the controller 500 may also update a stored look up table with newly generated data to account for changing processing conditions in a given processing apparatus. Software in the controller 500 can be configured to determine an optimum gas ratio and/or flow rate based upon the look up table for a give process recipe.

The plasma processing apparatus 10 and related gas supply delivery arrangement 100 disclosed herein may be integrated with electronics for controlling their operation before, during, and after processing of a semiconductor wafer or substrate. The electronics may be referred to as the "controller," which may control various components or subparts of the system or systems. For example, as illustrated in FIG. 1 the plasma processing apparatus 10 and/or the gas supply delivery arrangement 100 includes an associated controller 500. The controller 500, depending on the processing requirements and/or the type of plasma processing apparatus 10, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 500, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 500 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level (i.e. plasma processing apparatus 10) or as part of a remote computer) that combine to control a process on the chamber.

Without limitation, example plasma processing apparatus 10 may include processing chambers including a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing apparatuses or systems that may be associated or used in the fabrication and/or manufacturing of semiconductor wafers.

As noted above, depending on the process step or steps to be performed by the plasma processing apparatus 10, the controller 500 thereof might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory. Preferably, a non-transitory computer machine-readable medium includes program instructions for control of the plasma processing apparatus 10.

A method of using a gas supply delivery arrangement, as disclosed herein, for supplying process gas to a chamber of a plasma processing system wherein a semiconductor substrate is processed with gases introduced through at least first, second, and third gas injection zones. The gas supply delivery arrangement comprising a plurality of process gas supply inlets and a plurality of tuning gas inlets, a mixing manifold comprising a plurality of gas supply sticks each of which is adapted to provide fluid communication with a respective process gas supply, a plurality of tuning gas sticks each of which is adapted to provide fluid communication with a respective tuning gas supply, a first gas outlet adapted to deliver gas to the first gas injection zone, a second gas outlet adapted to deliver gas to the second gas injection zone, and a third gas outlet adapted to deliver gas to the third gas injection zone, a gas splitter in fluid communication with the mixing manifold, the gas splitter including a first valve arrangement which splits mixed gas exiting the mixing manifold into a first mixed gas which can be supplied to the first gas outlet and a second mixed gas which can be supplied to the second and/or third gas outlets, and a second valve arrangement which selectively delivers tuning gas from the tuning gas sticks to the first, second, and/or third gas outlets. The method comprises operating the first valve arrangement to deliver the first mixed gas to the first gas outlet and the second mixed gas to the second and/or third gas outlets, and operating the second valve arrangement to deliver one or more tuning gases to the first, second and/or third gas outlets.

The present invention has been described with reference to preferred embodiments. However, it will be readily apparent to those skilled in the art that it is possible to embody the invention in specific forms other than as described above without departing from the spirit of the invention. The preferred embodiments are illustrative and should not be considered restrictive in any way. The scope of the invention is given by the appended claims, rather than the preceding description, and all variations and equivalents which fall within the range of the claims are intended to be embraced therein.

What is claimed is:

1. A gas supply delivery arrangement for supplying process gas to a chamber of a plasma processing system wherein a semiconductor substrate is processed with gases introduced through at least first, second, and third gas injection zones, comprising:
   a plurality of process gas supply inlets and a plurality of tuning gas inlets; a mixing manifold comprising a plurality of gas supply sticks each of which is adapted to provide fluid communication with a respective process gas supply;
   a plurality of tuning gas sticks each of which is adapted to provide fluid communication with a respective tuning gas supply;
   a first gas outlet adapted to deliver gas to the first gas injection zone, a second gas outlet adapted to deliver gas to the second gas injection zone, and a third gas outlet adapted to deliver gas to the third gas injection zone;
   a gas splitter in fluid communication with the mixing manifold, the gas splitter including a first valve arrangement which splits mixed gas exiting the mixing manifold into:
      a first mixed gas which can be supplied to the first gas outlet; and
      a second mixed gas which can at different times be supplied to:
         only the second gas outlet;
         only the third gas outlet; and
         the second and third gas outlets; and
   a second valve arrangement which, at different times, selectively delivers tuning gas from the tuning gas sticks to:
      only the first gas outlet;
      only the second gas outlet;
      only the third gas outlet;
      only the first and second gas outlets;
      only the first and third gas outlets;
      only the second and third gas outlets; and
      the first, second, and third gas outlets.

2. The gas supply delivery arrangement of claim 1, wherein the second valve arrangement includes a first set of valves which selectively delivers a first tuning gas to a first tuning gas conduit in fluid communication with the first gas outlet, the second gas outlet, the third gas outlet, or combination thereof, a second set of valves which selectively delivers a second tuning gas to a second tuning gas conduit in fluid communication with the first gas outlet, the second gas outlet, the third gas outlet, or combination thereof, a third set of valves which selectively delivers a third tuning gas to a third tuning gas conduit in fluid communication with the first gas outlet, the second gas outlet, the third gas outlet, or combination thereof, and a fourth set of valves which selectively delivers a fourth tuning gas to a fourth tuning gas conduit in fluid communication with the first gas outlet, the second gas outlet, the third gas outlet, or combination thereof.

3. The gas supply delivery arrangement of claim 2, wherein the second set of valves includes valves which selectively connect first, second, third and fourth tuning gas sticks of the plurality of tuning gas sticks to the mixing manifold and/or a purge line.

4. The gas supply delivery arrangement of claim 2, wherein the first valve arrangement includes a first valve set with critical orifices to precisely control a ratio of the first mixed gas and deliver the first mixed gas to the first gas outlet, a second valve set with critical orifices to control a ratio of the second mixed gas and deliver the second mixed gas to the second and/or third gas outlet, and a third valve set which delivers the mixed gas to the second and/or third gas outlets.

5. The gas supply delivery arrangement of claim 1, wherein the first valve arrangement delivers the first mixed gas only to the first gas outlet and the second mixed gas only to the second and/or third gas outlets.

6. A plasma processing system including the gas supply delivery arrangement of claim 1, wherein the plasma processing system includes a chamber, a substrate support on which a semiconductor substrate is processed in the chamber, a gas injection system connected to the first, second, and third gas outlets of the gas supply delivery arrangement, a vacuum source operable to maintain the chamber at a desired vacuum pressure, and a power supply operable to energize gas in the chamber into a plasma, the gas injection system delivering gas from the gas supply delivery arrangement to at least first, second and third zones above the semiconductor substrate.

7. The plasma processing system of claim 6, wherein the first zone is a center zone of the semiconductor substrate, the second zone is a middle zone surrounding the center zone, and the third zone is an edge zone surrounding the middle zone.

8. The plasma processing system of claim 6, wherein the chamber is an inductively coupled plasma processing chamber in which the gas injection system is a gas distribution plate.

9. The plasma processing system of claim 6, wherein the chamber is a capacitively coupled plasma processing chamber in which the gas injection system is a showerhead electrode.

* * * * *